United States Patent
Hiromi et al.

(10) Patent No.: US 10,062,553 B2
(45) Date of Patent: Aug. 28, 2018

(54) SPUTTERING APPARATUS AND PROCESSING APPARATUS

(71) Applicant: CANON ANELVA CORPORATION, Kawasaki-shi, Kanagawa (JP)

(72) Inventors: Taichi Hiromi, Tokyo (JP); Hidetoshi Shimokawa, Tokyo (JP); Atsuyuki Ichikawa, Tokyo (JP)

(73) Assignee: Canon Anelva Corporation, Kawasaki-shi, Kanagawa-ken (JP)

( * ) Notice: Subject to any disclaimer, the term of this patent is extended or adjusted under 35 U.S.C. 154(b) by 0 days.

(21) Appl. No.: 15/420,472

(22) Filed: Jan. 31, 2017

(65) Prior Publication Data
US 2017/0140907 A1 May 18, 2017

Related U.S. Application Data

(63) Continuation of application No. PCT/JP2015/071788, filed on Jul. 31, 2015.

(30) Foreign Application Priority Data

Aug. 8, 2014 (JP) ................. 2014-162885

(51) Int. Cl.
*C23C 14/34* (2006.01)
*H01J 37/34* (2006.01)
(Continued)

(52) U.S. Cl.
CPC ........ *H01J 37/3447* (2013.01); *C23C 14/564* (2013.01); *C23C 16/4401* (2013.01);
(Continued)

(58) Field of Classification Search
CPC ... H01J 7/14; H01J 37/32477; H01J 37/32816
See application file for complete search history.

(56) References Cited

U.S. PATENT DOCUMENTS

| 6,987,271 B1* | 1/2006 | Hayashi ................. | H01J 37/18 250/441.11 |
| 2004/0262155 A1* | 12/2004 | Lombardi ............... | C23C 14/54 204/298.01 |

(Continued)

FOREIGN PATENT DOCUMENTS

| JP | 05-247639 A | 9/1993 |
| JP | 2000-028465 A | 1/2000 |

(Continued)

OTHER PUBLICATIONS

International Search Report (PCT/ISA/210) dated Oct. 13, 2015, by the Japanese Patent Office as the International Searching Authority for International Application No. PCT/JP2015/071788.

(Continued)

*Primary Examiner* — Jason Berman
(74) *Attorney, Agent, or Firm* — Buchanan Ingersoll & Rooney PC

(57) ABSTRACT

A sputtering apparatus includes a space defining member defining a sputtering space for forming a film on a substrate. The space defining member includes a concave portion, and an opening portion is provided in the bottom portion of the concave portion. The sputtering apparatus includes a shield member configured to shield the opening portion from the sputtering space. The opening portion is formed so that a pressure gauge capable of measuring the pressure in the sputtering space can be attached, and the shield member is arranged so that at least a part of the shield member is buried in the concave portion.

16 Claims, 4 Drawing Sheets

(51) Int. Cl.
  *G01L 21/00* (2006.01)
  *H01L 21/203* (2006.01)
  *H01L 21/285* (2006.01)
  *C23C 14/56* (2006.01)
  *C23C 16/44* (2006.01)
  *H01J 37/32* (2006.01)

(52) U.S. Cl.
  CPC ........ *G01L 21/00* (2013.01); *H01J 37/32816* (2013.01); *H01J 37/32935* (2013.01); *H01J 37/3411* (2013.01); *H01J 37/3441* (2013.01); *H01J 37/3476* (2013.01); *H01L 21/203* (2013.01); *H01L 21/285* (2013.01); *H01J 2237/026* (2013.01); *H01J 2237/24585* (2013.01); *H01J 2237/3322* (2013.01); *H01L 21/2855* (2013.01)

(56) References Cited

U.S. PATENT DOCUMENTS

2011/0089023 A1  4/2011  Tanaka et al.
2012/0228122 A1  9/2012  Minami

FOREIGN PATENT DOCUMENTS

| | | |
|---|---|---|
| JP | 2010-150572 A | 7/2010 |
| JP | 2010-163690 A | 7/2010 |
| JP | 2015-060877 A | 3/2015 |
| JP | 2015-131994 A | 7/2015 |
| WO | WO 2011/067820 A1 | 6/2011 |

OTHER PUBLICATIONS

Written Opinion (PCT/ISA/237) dated Oct. 13, 2015, by the Japanese Patent Office as the International Searching Authority for International Application No. PCT/JP2015/071788.

Notification of Reasons for Refusal dated Jul. 28, 2016, by the Japanese Patent Office for Application No. 2016-536796.

Decision to Grant a Patent dated Oct. 27, 2016, by the Japanese Patent Office for Application No. 2016-536796.

\* cited by examiner

FIG. 4A
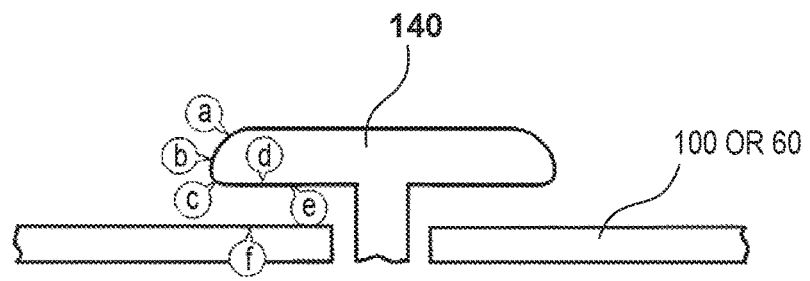
FIG. 4B
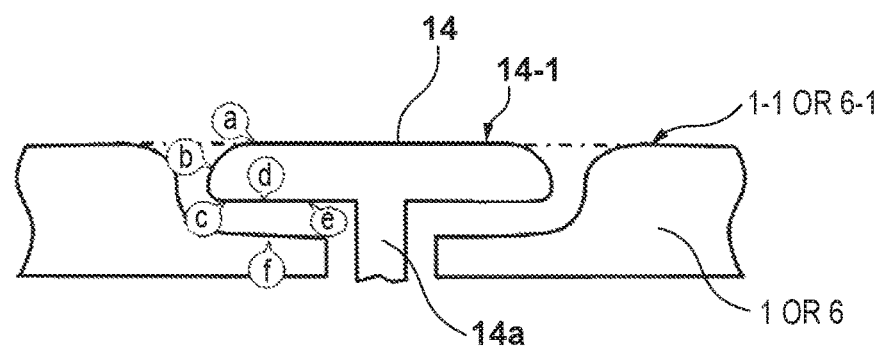
FIG. 4C
TABLE
| | POINT | | | | | |
|---|---|---|---|---|---|---|
| | a | b | c | d | e | f |
| A(%) | 100 | 100 | 100 | 100 | 100 | 100 |
| B(%) | 84 | 82 | 7 | 43 | 0 | 7 |

SPUTTERING APPARATUS AND PROCESSING APPARATUS

This application is a continuation of International Patent Application No. PCT/JP2015/071788 filed on Jul. 31, 2015, and claims priority to Japanese Patent Application No. 2014-162885 filed on Aug. 8, 2014, the entire content of both of which is incorporated herein by reference.

TECHNICAL FIELD

The present invention relates to a sputtering apparatus and a processing apparatus.

BACKGROUND ART

In recent years, along with micropatterning of semiconductor devices, accurate measurement of a pressure in a sputtering space in which sputtering is performed has become required in a sputtering process. On the other hand, if a pressure gauge is exposed to a sputtering space, the pressure gauge can become contaminated, problematically, due to a sputtered film or the like. Particularly, among pressure gauges, a diaphragm vacuum gauge is sensitive to contamination.

The sputtering apparatus disclosed in PTL 1 tries to reduce the amount of film entering an ion gauge connected to the opening portion by providing a shutter that can act as a shield in the chamber.

However, in the sputtering apparatus of PTL 1, when forming a thin film on a substrate such as a wafer, the thin film may become contaminated due to generation of particles (foreign substances) from the shutter or the like. If particles are present in the thin film, it can cause a critical defect in a product such as a semiconductor chip which includes the thin film and cause a reduction in yield. In recent years, due to advancements in microprocessing, further reduction of particles is required.

Furthermore, to achieve a high yield, stable process reproducibility is necessary. Hence, it is necessary to accurately measure the pressure in the sputtering space even during deposition.

CITATION LIST

Patent Literature

PTL 1: Japanese Patent Laid-Open No. 2010-150572

SUMMARY OF INVENTION

According to a first aspect of the present invention, there is provided a sputtering apparatus capable of reducing particle contamination of a film formed on a substrate, accurately measuring the pressure in a sputtering space during film formation, and reducing the amount of film entering (film formation on) a pressure gauge.

The first aspect of the present invention provides, for example, a sputtering apparatus comprising a space defining member defining a sputtering space for forming a film on a substrate. The space defining member includes a concave portion. An opening portion is provided in the bottom portion of the concave portion. The sputtering apparatus includes a shield member configured to shield the opening portion from the sputtering space. The opening portion is formed so that a pressure gauge which can measure the pressure in the sputtering space is attachable. The shield member is arranged so that at least a part of the shield member will be buried in the concave portion.

A second aspect of the present invention provides a processing apparatus that can reduce generation of particles and is advantageous in maintaining the measurement accuracy of a measurement device which communicates with a space for substrate processing.

The second aspect of the present invention provides, for example, a processing apparatus comprising a space defining member defining a space. The space defining member includes a concave portion. An opening portion through which a measurement device communicates with the space is provided in the bottom portion of the concave portion. The processing apparatus includes a shield member configured to shield a linear path between the space and the opening portion. At least a part of the shield member is arranged in the concave portion.

BRIEF DESCRIPTION OF DRAWINGS

FIG. 4A is a view showing film thickness evaluation points a to f in the comparative example shown in FIG. 3A;

FIG. 4B is a view showing film thickness evaluation points a to f in the embodiment shown in FIG. 3B;

FIG. 4C is a table showing simulation results (ratios of formed film thicknesses) of the comparative example shown in FIG. 3A and the embodiment shown in FIG. 3B;

DESCRIPTION OF EMBODIMENTS

Figure 1:
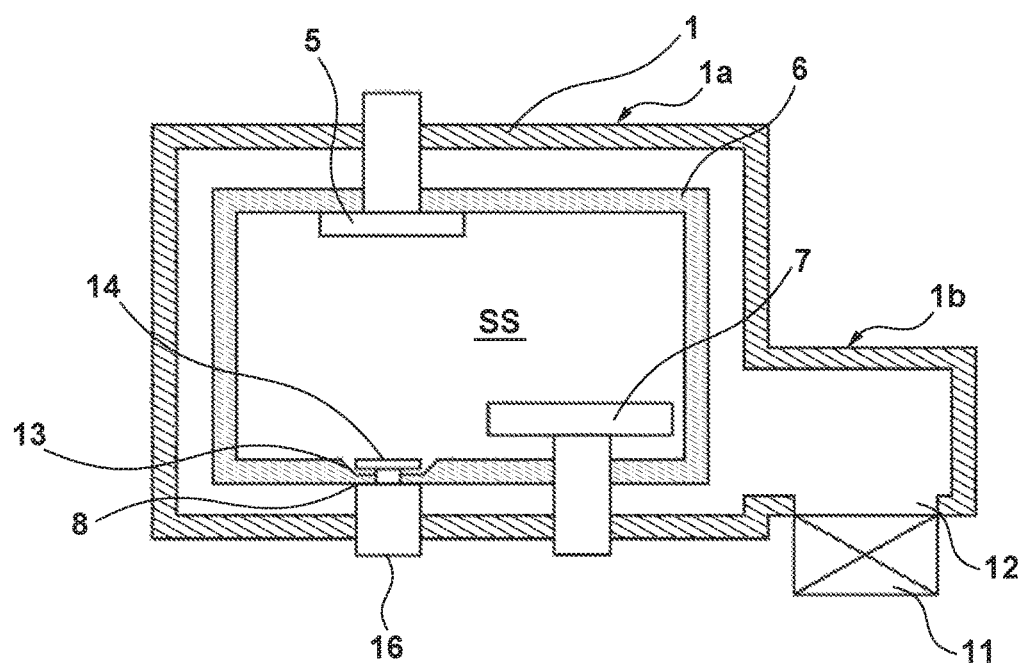
FIG. 1 is a view showing a sputtering apparatus according to an embodiment of the present invention.

A sputtering apparatus according to an embodiment of the present invention will be described with reference to FIG. 1. FIG. 1 shows the sputtering apparatus of the present invention. The sputtering apparatus of FIG. 1 includes a protective member 6 (divisible) delimiting the sputtering space in a vacuum chamber 1 and forms a thin film of sputtered particles (for example, metallic) that have flown from a target 5 provided in the upper portion of the vacuum chamber 1 onto the surface of a substrate (not shown) placed on a substrate stage 7 in the vacuum chamber 1. In the embodiment, the protective member 6, which is provided so as to cover the inner wall of the vacuum chamber 1, corresponds to a space defining member which defines a sputtering space SS where sputtering is performed.

The sputtering apparatus of FIG. 1 includes a concave portion 13 provided in the protective member 6, an opening portion 8 provided in the bottom portion of the concave portion 13, a pressure gauge 16 which is attached to the opening portion 8 and can measure the pressure in the sputtering space SS, and a shield member 14 which shields the opening portion 8 from the sputtering space SS. In addition, the sputtering apparatus of FIG. 1 includes a gas introduction port (not shown) which introduces a gas (for example, argon) into the sputtering space SS defined by the protective member 6 and an exhaust port 12 which exhausts air from the vacuum chamber 1. The shield member 14 is arranged in a state that it is buried in the concave portion 13. The exhaust port 12 is connected to a main valve 11.

In the sputtering apparatus of FIG. 1, the protective member 6 is an optional component. If no protective member 6 is provided in the sputtering apparatus of FIG. 1, it is preferable to provide the target 5 in the upper portion of a vacuum chamber 1a, provide the substrate stage 7 in the lower portion of the vacuum chamber 1a, and form the concave portion 13 in the lower wall of the vacuum chamber 1a. In this case, out of the vacuum chamber 1a, a portion provided with the target 5, the substrate stage 7, and the shield member 14 corresponds to a member that forms at least a part of the wall of the vacuum chamber 1. In addition, out of a vacuum chamber 1b, a portion where the exhaust port 12 and a main valve 12 are provided corresponds to a member which does not form the at least the part of the wall of the vacuum chamber 1. Furthermore, the vacuum chamber 1a corresponds to the space defining member, and the interior of the vacuum chamber 1a corresponds to the sputtering space.

Figure 6:
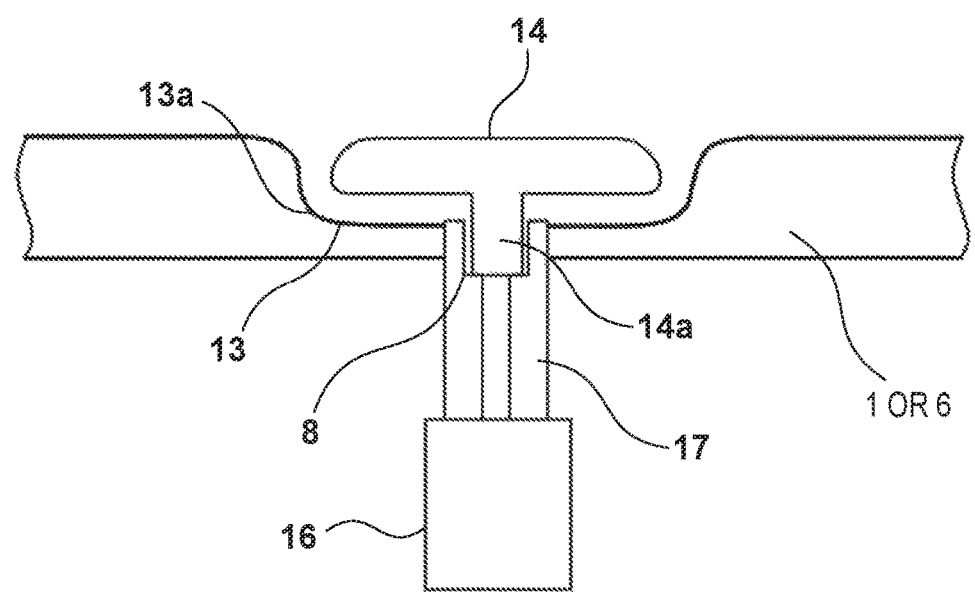
FIG. 6 is a view showing a third example of the buried shield member of the present invention.

Although not shown in the sputtering apparatus of FIG. 1, a connecting member (vacuum pipe) 17 which has one end attached to the opening portion 8 and the other end attached to the pressure gauge 16 may be separately provided as shown in FIG. 6.

Furthermore, the sputtering apparatus of FIG. 1 can include at least one of a heater for heating the substrate stage 7 and a water cooling jacket for cooling the substrate stage 7. A vacuum pump (for example, a dry-shield pump or a turbo-molecular pump) (not shown) is connected to the exhaust port 12.

Figure 2:
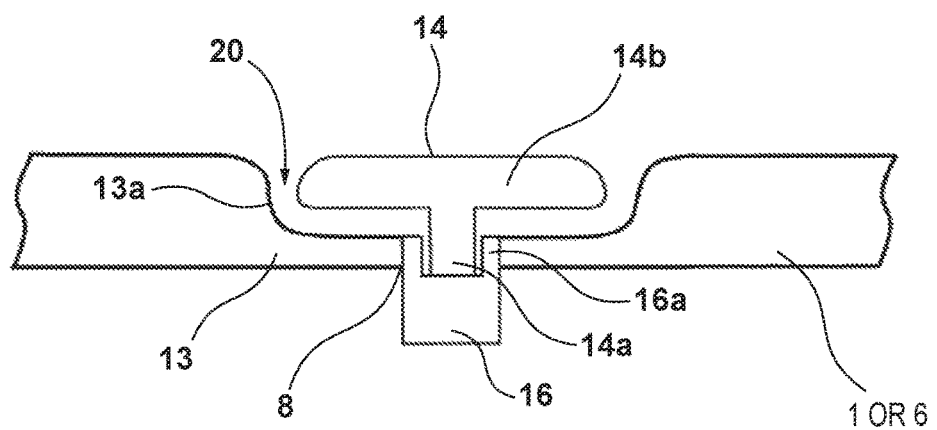
FIG. 2 is an enlarged view of a buried shield member according to the embodiment of the present invention.

Also, in the apparatus of FIG. 1, the pressure gauge 16 is preferably placed near the substrate stage 7 where film formation on the substrate is performed so that the process pressure value of the sputtering space SS inside the protective member 6 can be measured as accurately as possible. FIG. 2 is an enlarged view of the buried shield member 14. As schematically shown in FIG. 2, the shield member 14 preferably has an umbrella-shaped structure. In the present specification, the "umbrella shape" refers to a shape having a cover 14b and a columnar support member (for example, a cylinder portion) 14a supporting the cover 14b. The umbrella shape can include a mushroom shape. The shape of the cover 14b can include a circle, an ellipse, a rounded-corner rectangle, a polygon, or a rounded-corner polygon. The shield member 14 can be arranged in the concave portion 13, including an R portion 13a, provided in the protective member 6 or the vacuum chamber 1. In one example, the shield member 14 is not fixed in the concave portion 13 by a means such as a screw, and the shield member 14 is configured such that the columnar support member 14a is inserted into a concave portion 16a of the pressure gauge 16 which allows detaching the shield member 14 from the concave portion 16a. This is to facilitate maintenance and avoid the removal of the film that has adhered to the screw.

Figure 3A:
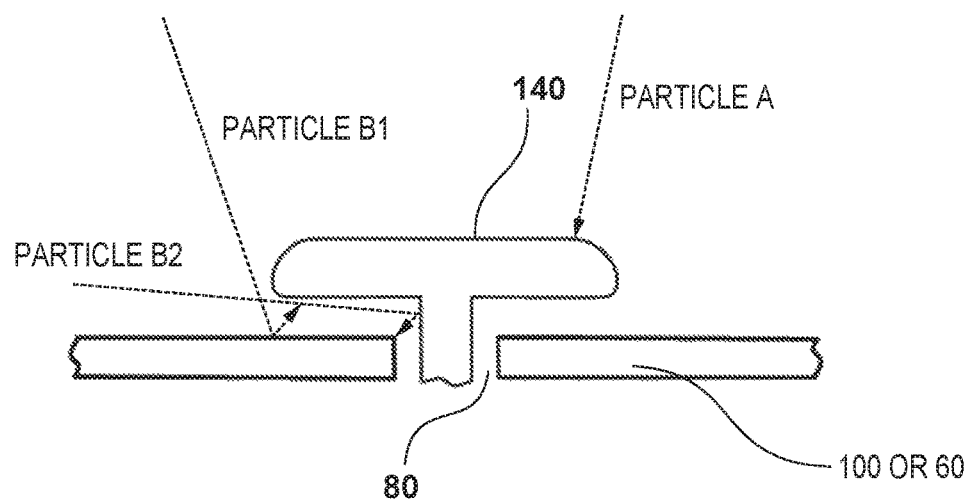
FIG. 3A is a view showing a comparative example.
Figure 3B:
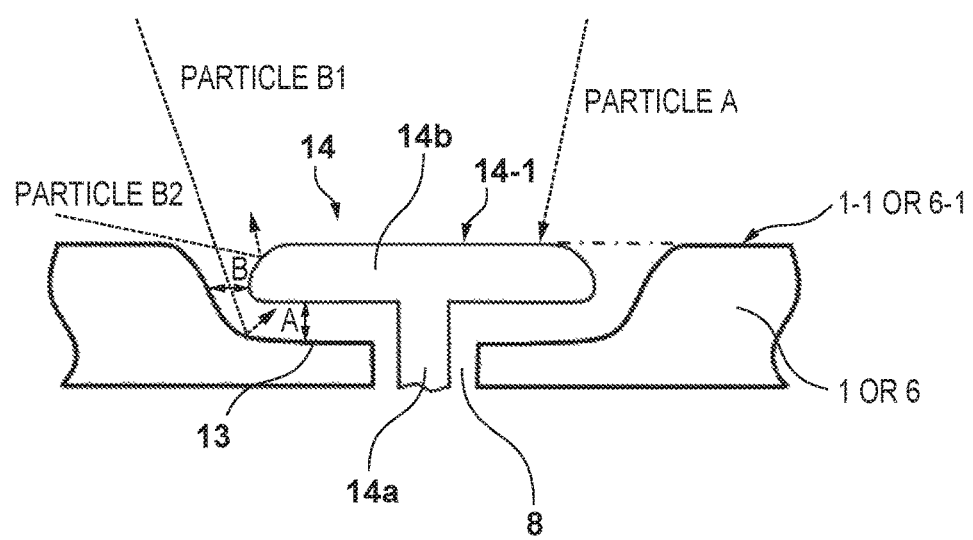
FIG. 3B is a view showing the buried shield member according to the embodiment of the present invention and a shield member of the comparative example.

FIG. 3A shows a comparative example in which a protective member 60 or a vacuum chamber 100 does not include the concave portion 13 and a shield member 140 is arranged without the cover portion 14b positioned in the concave portion 13. FIG. 3B shows an arrangement of the embodiment in which the concave portion 13 is provided in the protective member 6 or the vacuum chamber 1, and the shield member 14 is arranged so as to position the cover 14b in the concave portion 13.

Each sputtered particle flies from the target 5 to the shield member 140 in accordance with the cosine law. In the case of FIG. 3A, a sputtered particle A, which flies from the target 5, directly flies to the shield member 140 and forms a film on the shield member 140. Since the energy of the sputtered particle A is strong, the adhesion of the sputtered particle A to the shield member 140 is strong. Hence, the possibility that the film formed on the shield member 140 by the sputtered particle A will peel off and fly to the substrate as a particle is low. In addition, in the case of FIG. 3A, sputtered particles B1 and B2 that fly out from the target 5 in accordance with the cosine law are bounced back once or a plurality of times by the protective member 60, the vacuum chamber 100, or the shield member 140. The sputtered particles indirectly fly to the shield member 140 and form a film on the shield member 140. Particularly, out of the surface of the shield member 140, the lower-side region of the shield member 140 not facing the target 5 is a portion not visible from the target 5, that is, a portion to which the sputtered particles A, B1, and B2 do not directly fly. Since the sputtered particles B1 and B2 form a film upon flying to the lower-side region of the shield member 140 after the energy is reduced, their adhesion to the lower-side region of the shield member 140 is weak. In the case of FIG. 3A, the film formed on the lower-side region of the shield member 140 by the sputtered particles B1 and B2 can peel off and fly to the substrate as particles, thereby contaminating the substrate. Furthermore, in the case of FIG. 3A, the sputtered particles B1 and B2 can fly to the pressure gauge, and the pressure gauge 16 can be contaminated by the sputtered film or the like.

In the case of FIG. 3B, the sputtered particle A which flies out from the target 5 directly flies to the shield member 14 and forms a film on the shield member 14. Since the energy of the sputtered particle A is strong, adhesion of the sputtered particle A to the shield member 14 is strong. Hence, similarly to the case of FIG. 3A, the possibility that the film formed on the shield member 14 will peel off and fly as particles to the substrate is low.

Out of the surfaces of the shield member 14, the lower-side region of the shield member 14 which does not face the target 5 is a portion not visible from the target 5, that is, a portion to which the sputtered particles A, B1, and B2 do not directly fly. The sputtered particles B1 and B2 which fly out from the target 5 in accordance with the cosine law are bounced back once or a plurality of times by the protective member 6, the vacuum chamber 1, or the shield member 14 and indirectly fly to the shield member 14. In the case of FIG. 3B, in order to prevent the sputtered particle B1 from entering, the cover 14b of the shield member 14 is arranged on the concave portion 13 of the protective member 6 or the vacuum chamber 1, and an entrance 20 leading to the lower-side region of the shield member 14 is made small. Hence, compared to the case of FIG. 3A, there is low probability that the sputtered particle B1 will form a film on the lower-side region of the shield member 14.

In a case in which the shield member 14 is not screwed, for example, as shown in FIG. 3B, it may be convenient to provide the columnar support member 14a (for example, a cylindrical member) which can be inserted to the opening portion 8 of the protective member 6 or the vacuum chamber 1 on the central portion of the backside of the cover 14b and fix the columnar support member 14a by inserting the columnar support member 14a in the concave portion 16a of the pressure gauge 16.

In FIG. 3B, the shield member 14 is arranged so that an upper surface 14-1 of the shield member 14 arranged in the concave portion 13 and an upper surface 6-1 of the protective member 6 or an upper surface 1-1 of the vacuum chamber 1 are flush with each other. However, this is but only one arrangement example of the present invention. The shield member 14 can be arranged so as to be completely buried in the concave portion 13 so the upper surface 14-1 of the shield member 14 and the upper surface 6-1 of the protective member 6 or the upper surface 1-1 of the vacuum chamber 1 are not flush with each other. Alternatively, the shield member 14 can be arranged so that a part of the cover 14b protrudes from the upper surface 6-1 or the upper surface 1-1 of the vacuum chamber 1.

In addition, if a gap distance B of FIG. 3B is too small, it can hinder measurement by a measurement device such as the pressure gauge 16. Hence, it is desirable for the gap distance B to have approximately the same length as a gap distance A.

FIGS. 4A to 4C show the results from simulating the thicknesses of the films formed on the shield members in the comparative example shown in FIG. 3A and the embodiment shown in FIG. 3B. FIG. 4A shows film thickness evaluation points a to f in the comparative example shown in FIG. 3A, and FIG. 4B shows the film thickness evaluation points a to f in the embodiment shown in FIG. 3B.

FIG. 4C shows the ratios of the film thicknesses at the respective evaluation points a to f of the embodiment shown in FIG. 3B with respect to the film thicknesses at the respective evaluation points a to f of the comparative example shown in FIG. 3A. More particularly, FIG. 4C shows the ratios of film thicknesses at the respective evaluation points a to f of the embodiment shown in FIG. 3B when the film thicknesses at the respective evaluation points a to f of the comparative example shown in FIG. 3A all are 100%. The film thicknesses at the evaluation points a to f of the embodiment shown in FIG. 3B are 84%, 82%, 7%, 43%, 0%, and 7% of the film thicknesses at the evaluation points a to f, respectively, of the comparative example shown in FIG. 3A.

It can be understood that film portions formed by the sputtered particles that have flown from the target are thinner at all of the evaluation points a to f of the embodiment shown in FIG. 3B than those of the comparative example shown in FIG. 3A. Therefore, according to the embodiment shown in FIG. 3B, the generation of particles in the shield member 14 can be reduced, and the contamination of the film formed on the substrate placed on the substrate stage 7 due to particles, for example, incorporation of particles to the film can be reduced. In addition, reducing the generation of particles in the shield member 14 is advantageous in reducing the adherence of particles to the pressure gauge 16 (contamination of the pressure gauge 16). This contributes to the maintenance of measurement accuracy by the pressure gauge 16. Particularly, in a case in which the pressure gauge 16 is a diaphragm vacuum gauge, the measurement accuracy largely lowers due to particle adhesion (contamination) (that is, sensitive to contamination), so that the reduction of particle generation in the shield member 14 has great significance.

Figure 5:
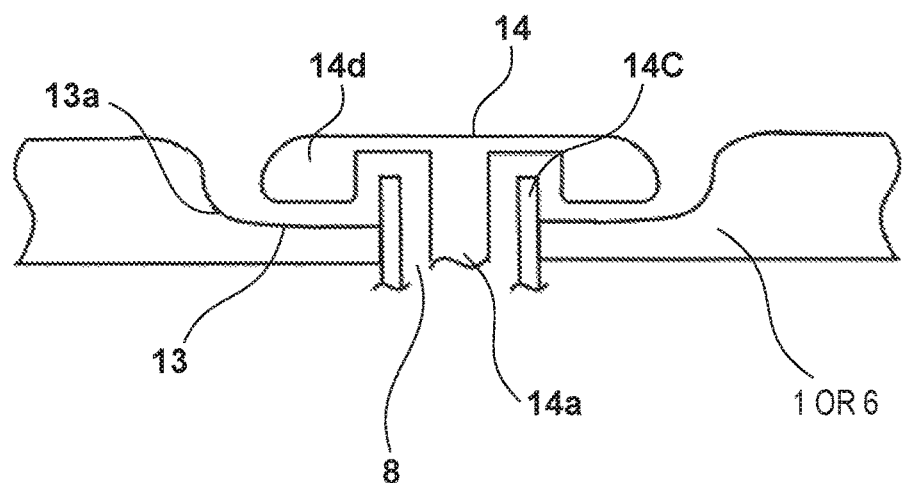
FIG. 5 is a view showing a second example of the buried shield member of the present invention.

FIG. 5 shows a second example of the buried shield member 14. The shield member 14 shown in FIG. 5 includes an umbrella-shaped first member 14d provided so as to have a predetermined gap with the bottom portion of the concave portion 13 and a cylindrical second member 14c provided in the peripheral portion of the opening portion 8. A first member 14b and the second member 14c form a labyrinth structure. In the second example, the labyrinth structure is provided by a structure in which the first member 14b which has concave portions and the second 14c which has convex portions are fitted without contacting each other. The first member 14b and/or the second member 14c may be integrated into the protective member 6 or the vacuum chamber 1 or be separated from the protective member 6 or the vacuum chamber 1.

FIG. 6 shows a third example of the buried shield member of the present invention. In FIG. 6, a connecting member (vacuum pipe) 17 which has one end attached to the opening portion 8 and the other end attached to the pressure gauge 16 is provided. In this case, the shield member 14 is preferably formed by a separate member from the connecting member (vacuum pipe) 17.

The above description shows an example in which the present invention has been applied to a sputtering apparatus. However, the present invention is also applicable to other processing apparatuses such as a CVD apparatus, an etching apparatus, or the like. The measurement device which is to be connected to the opening portion 8 can be a different measurement device from the pressure gauge 16. The measurement device can be, for example, an analyzing apparatus that analyzes a gas. The opening portion 8 which makes the measurement device and a space (space for substrate processing) corresponding to the sputtering space SS in the aforementioned example communicate. The shield member 14 is arranged so as to block a linear path between the space and the opening portion 8.

The present invention is not limited to the above-described embodiments, and various changes and modifications can be made within the spirit and scope of the present invention. Therefore, to apprise the public of the scope of the present invention, the following claims are made.

REFERENCE SIGNS LIST

1: vacuum chamber
5: target
6: protective member
7: substrate stage
8: opening portion
13: concave portion
14: shield member
16: pressure gauge
17: connecting member

The invention claimed is:
1. A sputtering apparatus comprising:
a space defining member defining a sputtering space for forming a film on a substrate, wherein
the space defining member has an inner surface facing the sputtering space, the space defining member including a concave portion having a bottom surface which is recessed from the inner surface,
an opening portion is provided in the bottom surface of the concave portion,
the sputtering apparatus further comprises a shield member configured to shield the opening portion from the sputtering space, the shield member including a cover and a support member supporting the cover at a first end of the support member,
the opening portion is formed so that a pressure gauge which can measure a pressure in the sputtering space is attachable,
the shield member is fixed at a state that at least a part of the cover is arranged in the concave portion and a second end of the support member is arranged in the opening, and the shield member is configured to be removed from the concave portion by moving the shield into the sputtering space.

2. The sputtering apparatus according to claim 1, wherein the space defining member is a member forming at least a part of a wall of a vacuum chamber.

3. The sputtering apparatus according to claim 1, wherein the space defining member is a protective member provided so as to cover an inner wall of a vacuum chamber.

4. The sputtering apparatus according to claim 1, wherein the shield member has an umbrella shape.

5. The sputtering apparatus according to claim 1, wherein the cover includes an umbrella-shaped member which is provided such that a gap is formed between the bottom surface of the concave portion and the umbrella-shaped member, and the shield member further includes a cylindrical member provided in a peripheral portion of the opening portion, and the shield member is configured such that a labyrinth structure is provided in a region between the umbrella-shaped member and the cylindrical member.

6. The sputtering apparatus according to claim 1, wherein a pressure gauge capable of measuring a pressure in the sputtering space is attached in the opening portion.

7. The sputtering apparatus according to claim 1, wherein the shield member is attached to the pressure gauge and is detachable from the pressure gauge.

8. The sputtering apparatus according to claim 6, wherein the pressure gauge is attached to the opening portion via a connecting member, wherein one end of the connecting member is attached to the opening portion and another end of the connecting member is attached to the pressure gauge, and the support member of the shield member is attached to the connecting member.

9. The sputtering apparatus according to claim 8, wherein the shield member is detachable from the connecting member.

10. A film forming apparatus comprising:
a space defining member defining a space for forming a film on a substrate, wherein
the space defining member has an inner surface facing the space, the space defining member including a concave portion having a bottom surface which is recessed from the inner surface, and
an opening portion through which a measurement device communicates with the space is provided in the bottom surface of the concave portion,
the film forming apparatus includes a shield member configured to interrupt a linear path between the space and the opening portion, the shield member including a cover and a support member supporting the cover at a first end of the support member,
the shield member is fixed at a state that at least a part of the cover member is buried in the concave portion and a second end of the support member is arranged in the opening, and
the shield member is configured to be removed from the concave portion by moving the shield into the space.

11. The sputtering apparatus according to claim 1, wherein the pressure gauge has a concave part, and
the shield member is attached to the pressure gauge by inserting the support member into the concave part of the pressure gauge.

12. The sputtering apparatus according to claim 11, wherein the first end of the support member is connected to the cover and the second end of the support member is inserted into the concave part of the pressure gauge.

13. The sputtering apparatus according to claim 1, wherein the first end of the support member is connected to the cover and the second end of the support member is inserted into the opening portion.

14. The film forming apparatus according to claim 10, wherein the first end of the support member is connected to the cover and the second end of the support member is inserted into the opening portion.

15. The sputtering apparatus according to claim 1, wherein the cover has a first surface and a second surface opposite to the first surface, and the first end of the support member is connected to the second surface.

16. The sputtering apparatus according to claim 15, wherein the at least a part of the cover is arranged in the concave portion such that the first surface is exposed to the sputtering space.

* * * * *